United States Patent [19]

Umbaugh

[11] 3,838,501

[45] Oct. 1, 1974

[54] METHOD IN MICROCIRCUIT PACKAGE ASSEMBLY PROVIDING NONABRASIVE, ELECTRICALLY PASSIVE EDGES ON INTEGRATED CIRCUIT CHIPS

[75] Inventor: Charles Wayne Umbaugh, Phoenix, Ariz.

[73] Assignee: Honeywell Information Systems, Inc., Waltham, Mass.

[22] Filed: Feb. 9, 1973

[21] Appl. No.: 331,163

[52] U.S. Cl. .................................... 29/583, 29/589
[51] Int. Cl. ........................................... B01j 17/00
[58] Field of Search ............. 29/583, 588, 577, 589

[56] References Cited

UNITED STATES PATENTS

| | | | |
|---|---|---|---|
| 2,784,479 | 3/1957 | Roberts | 29/583 |
| 3,325,586 | 6/1967 | Suddick | 29/588 |
| 3,374,533 | 3/1968 | Burks | 29/588 |
| 3,550,261 | 12/1970 | Schroeder | 29/583 |
| 3,608,186 | 9/1971 | Hutson | 29/583 |

*Primary Examiner*—Roy Lake
*Assistant Examiner*—W. C. Tupman
*Attorney, Agent, or Firm*—Edward A. Gerlaugh; Walter W. Nielsen; Edward W. Hughes

[57] ABSTRACT

A channel is formed in the kerf area of an integrated circuit wafer prior to forming a passivating or protective layer of material on the surface of the wafer. The passivated channel, after separation of the wafer into chips, forms conditioned edges which prevent shorting of interconnecting leads.

3 Claims, 5 Drawing Figures

PATENTED OCT 1 1974

3,838,501

METHOD IN MICROCIRCUIT PACKAGE ASSEMBLY PROVIDING NONABRASIVE, ELECTRICALLY PASSIVE EDGES ON INTEGRATED CIRCUIT CHIPS

BACKGROUND OF THE INVENTION

The invention relates to the fabrication and assembly of microelectronic devices and, more particularly, to the joining of integrated circuits mounted face-up on a substrate to electrical conductors on the substrate.

During the manufacture of microelectronic circuit devices, standard processing practice may include the forming of a continuous thin layer of protective or passivating material, usually silicon dioxide, over the active surface of a wafer of semiconductor material on which a plurality of circuits have been formed. Apertures are subsequently formed in the continuous layer at circuit contact pad sites to provide electrical connections between the integrated circuits and external components or circuits. When the passivated wafer is diced to form individual circuits or groups of circuits, the top edges of the separated chips may exhibit microscopic size irregularities such as chipping or fracturing of the silicon dioxide or the bulk semiconductor material immediately under the relatively thin passivating layer.

One method currently used to form modular microelectronic assemblies is to mount the integrated circuit dice face-up (i.e., with the back surface of the chips attached) to a substrate or planiform insulator, and utilize flexible, cantilevered leads attached to the contact pads of the integrated circuits to connect the circuits with other circuits on the substrate. The plane of the chip contact pads is generally higher than the plane of the substrate circuits. When the cantilevered leads on the chip are forced downward to meet the circuits on the surface of the substrate, electrical shorts sometimes occur between the leads and the bulk semiconductor material, due to the previously mentioned chip-edge irregularities. The likelihood of lead to semiconductor shorts is increased when silicon dioxide chipping or fracturing is induced by the dicing technique, and sharp edges or voids are produced in the passivating layer. If the interconnecting lead is allowed to touch the chipped or sharp-edged silicon dioxide at the edge of the die, only a small amount of inadvertent abrasive action is required to deform the lead, causing it to make electrical contact with the bulk semiconductor material underlying the thin oxide layer at the edge. The only positive safeguard against such shorting in the prior art has been the mechanical forming or bending of the cantilevered leads so that they cannot come into contact with the chip edge. However, mechanical lead forming is not a desirable long term solution because it requires special tooling and the process is difficult to control, especially in multilead bonding operations.

It is desirable, therefore, to provide integrated circuit chips with electrically passive top edges to reduce the possibility of interconnecting lead to chip-edge shorts, and to provide such passivation during wafer processing, thus precluding the mechanical forming of leads.

SUMMARY OF THE INVENTION

The present invention provides an inexpensive solution to the problems of the prior art by diverting the wafer from the standard integrated circuit fabrication process, just prior to the application of the final passivating layer, to a process step wherein channels are formed in the kerf area of the wafer. The wafer is then returned to the conventional processing sequence, where the next operation is forming the passivating layer on the active surface of the wafer. Upon completion of standard wafer processing, the wafer is diced by any of the techniques well known in the art such that the separating kerf is along the centerline of the channel and has a width substantially less than the width of the channel. The bisected channel forms chamfered, non-abrasive edges on the chips which are electrically isolated from the bulk semiconductor material. The chamfered edges may serve as a fulcrum point for flexible cantilevered leads attached to the conductive lands or pads of the chip, when the leads are forced downward to make electrical contact with external circuits on a substrate to which the chip is attached; mechanical forming of the leads is not required.

The invention is pointed out with particularity in the appended claims; however, other objects and features will become more apparent and the invention itself will best be understood by referring to the following description and embodiments taken in conjunction with the accompanying drawings.

DESCRIPTION OF THE PREFERRED EMBODIMENT

Figure 1:
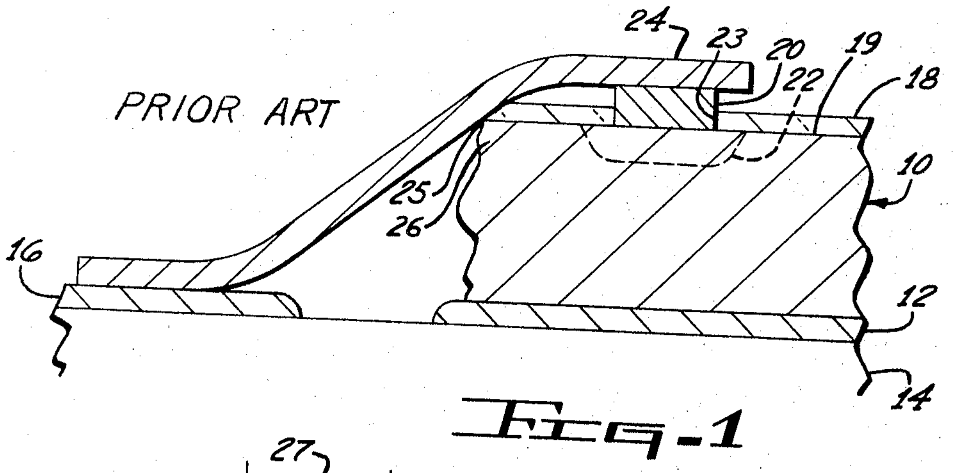
FIG. 1 illustrates the problem of the prior art.

Referring to FIG. 1, a chip or die 10, which may be a monolithic device formed in a body of semiconductor material such as silicon, is shown attached by means of a die bonding pad 12 to a substrate 14 of insulative material. A layer 18 of passivating or protective material such as silicon dioxide covers an active surface 19 of the chip 10. The passivating layer 18 is usually added while the chip 10 is still in wafer form by a known process such as chemical deposition, electrolytic deposition, reactive sputtering, or thermal oxidation.

A conductive land or pad 20 is associated with a circuit device 22 formed on the active surface 19 of the chip 10 in accordance with techniques well known in the art. The circuit device 22 is represented by the dashed line in FIG. 1. The pad 20 is formed directly over the circuit 22; electrical contact between the pad 20 and the circuit 22 is established through an aperture 23 formed in the layer 18 of passivating material. The forming of the device 22, the aperture 23 and the pad 20 is by conventional techniques. For a detailed description of the processes, materials and techniques utilized for metals joining of microelectronic circuitry, reference is made to chapter 13 of "Handbook of Materials and Processes for Electronics," edited by Charles A. Harper and published in 1970 by the McGraw-Hill Book Company, New York, N.Y.

One method currently used to form modular assemblies of integrated circuits is to attach the chip 10 face-up on the substrate or planiform insulator 14 and, utilizing a flexible cantilevered lead 24, connect the contact pad 20 to another circuit on the substrate. A circuit 16 of conductive material, only a fragment of which is shown in FIG. 1, is provided on the surface of the substrate 14 to connect the devices of one chip to the devices of another chip. The lead 24 may be attached to the pad 20 in accordance with a tape automated bonding (TAB) process described in my copending application Ser. No. 232,029, now U.S. Pat. No. 3,777,365, assigned to the same assignee as the present invention.

Figure 3:
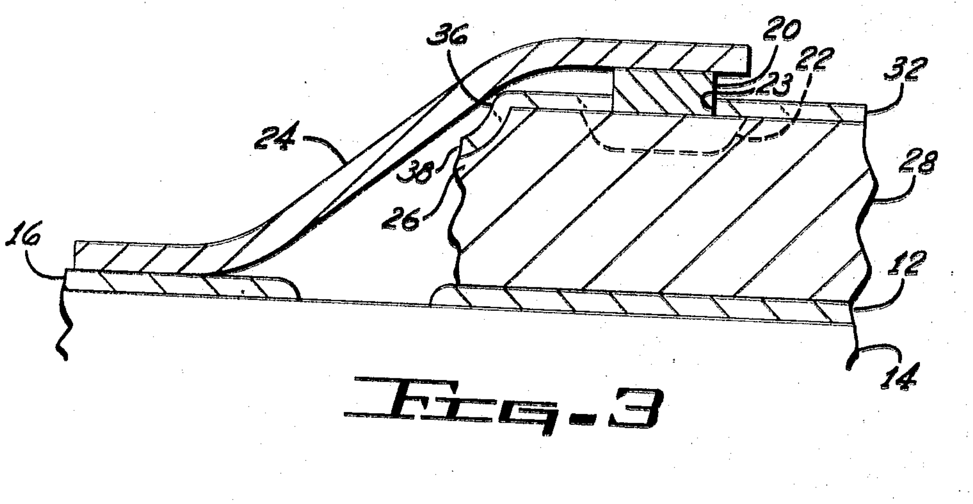
FIG. 3 illustrates an integrated circuit chip fabricated and connected to a substrate in accordance with the process of the present invention.

Normally, an integrated circuit has a plurality of devices or regions 22 on which conductive lands or pads 20 are formed for the attachment of interconnecting leads such as the lead 24 of FIG. 1. Further, a plurality of devices or components such as the chip 10 are interconnected by conductive circuits 16 of the substrate 14 thereby forming a modular assembly comprising many microelectronic devices. For simplicity, reference is made primarily to a single illustrated device and lead 24 throughout the present description. The assembly described herein with reference to FIGS. 1 or 3 is exemplary in nature, and although the substrate 14 may be described, for example, as comprising a ceramic wafer having a conductive pattern 16 of deposited gold film, it may also be of an organic dialectric material having copper foil circuits. It is further understood that the drawings are not to scale and the dimensions of the various elements shown in the drawings are exaggerated in order to clarify the explanation and therefore the understanding of my invention.

Referring still to FIG. 1, when the lead 24 attached to the conductive pad 20 is forced downward from the plane of the pad 20 to meet the plane of the conductive circuit 16 and make electrical contact therewith, electrical shorts often occur in an area 25 along the edge of the chip 10 as shown in FIG. 1. The lead 24 may initially contact the exposed silicon 26 or be deformed by abrasion and subsequently contact the bulk silicon material 26 of the chip 10.

Shorting of the lead 24 to the bulk silicon 26 as illustrated in FIG. 1 is a problem related primarily to dice separation. Processes for separating a wafer into dice include mechanical processes such as scribing and breaking, sawing, and the like, and chemical etching. Although chemical etching produces the smoothest surfaces at the separations, the etching process is difficult to control because of contaminant problems and anisotropic etching due to the crystal lattice orientation of the wafer. Therefore, the mechanical dicing processes are often preferred because they are less expensive and are more easily controlled.

In the scribe-and-break process, a diamond or carbide tipped needle is drawn across the wafer surface in the kerf area between the active devices formed on the wafer, thus forming a grid pattern of scratches in the silicon. Mechanical deformation as by force-flexing the scribed wafer against a resilient surface causes fracture of the silicon along the scribed lines in a fashion similar to glass cutting. Unlike glass, however, the silicon is monocrystalline, hence there is preferential fracture along the crystal planes, which may or may not coincide with the direction of the scribed lines. It is desirable, therefore, to scribe so that fracture will occur between the most easily cleaved (111) planes. The needle geometry and pressure are extremely important if sharply scribed lines with minimum chipping are to be obtained. Standard practice demands that the layer of oxide in the regions to be scribed be as thin as possible in order to prevent excessive chipping of the oxide.

Sawing has also been adapted for dice separation. Diamond impregnated wheels can be used, or an abrasive slurry can be fed to the edge of a rotating blade to provide cutting action. Taut parallel wires, in place of wheels, can also be used with abrasive slurry.

Three mechanical dice separation techniques were evaluated in order to determine their effect on chip-edge configurations: diamond scribe-and-break, wire sawing, and diamond wheel sawing. Chip edge characteristics observed in the analysis of these techiques were silicon dioxide chipping, bulk structural damage, and edge smoothness. There was considerable damage and fracturing introduced by all three of the mechanical dicing techniques. Cross-sectioned samples showed that the damage was not confined to the immediate surface, but frequently extended several mils into the bulk silicon material. Bulk fracturing was least evident in the diamond scribe-and-break technique, but on the other hand, this technique caused the worst silicon dioxide chipping. Internal structural damage seemed the worst for the wire-sawing technique. A comparison of the cut surfaces yielded by the wire sawing with the surfaces yielded by the diamond wheel sawing showed substantially more tearing action in the wire-sawed samples. Overall, the diamond wheel dicing technique appeared to yield the least amount of structural damage, the least amount of silicon dioxide chipping, and a relatively smooth sawed surface.

The scribing of a silicon wafer with a laser beam was also evaluated for comparison purposes. Scribed lines were formed in a 10 mil thick silicon wafer using a Holobeam Series 250 YAG laser with a motor driven scanning table. A current level of 12.5 amps was found to yield the most satisfactory scribe. The laser produced a well-defined scribe line approximately 2 mils deep, and introduced only minor structural damage in the bulk silicon material. However, excessive particulate debris was deposited on the wafer surface immediately adjacent the scribe mark. This debris consisted essentially of silicon material which was discharged from the scribed cavity under thermal excitation. The laser scribing technique yielded extremely smooth edges; however, the silicon ejecta appeared sufficient to cause lead to silicon shorting at the edge of the scribe line.

Figure 2A:
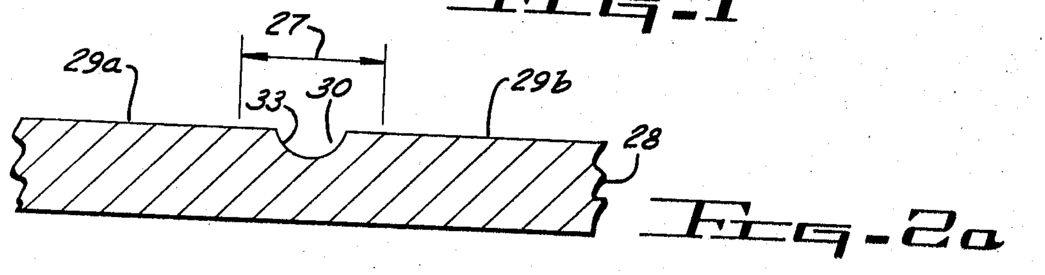
FIGS. 2*a*, 2*b* and 2*c* illustrate diagrammatically the method of forming a protected edge in accordance with the present invention.

A method for providing chip edge protection in accordance with the present invention is described with reference to FIG. 2. FIG. **2*a* represents a portion of a silicon wafer 28 having a kerf area the width of which is designated by an arrow 27. The kerf area 27 separates two devices (not shown) formed on the active surface of the wafer 28 and designated generally by reference numerals 29*a*, 29*b*. The fabrication of the circuit devices themselves forms no part of my invention; for a detailed description of semiconductor device processing, reference is made to chapter 14, pages 100–109 of the aforementioned Handbook by Harper. The wafer 28 of FIG. 2*a* represents a wafer in the stage of processing just prior to final oxide regrowth for the purpose of forming the protective or passivating layer of silicon dioxide over the previously formed devices 29*a*, 29*b*. A groove or channel 30 may be formed either by chemical or mechanical means in the kerf area 27 of the wafer 28. A MicroTech model 3312 wire saw with 8-mil diameter stainless steel wire was used to cut the channel 30 in the silicon wafer 28 for one batch of test wafers. The channel 30 was cut to a depth of approximately one-third the thickness of the wafer 28. Two sets of grooves were cut for evaluation, one utilizing 600 grit silicon carbide slurry, the other using 1000 grit silicon carbide slurry. Although the channel 30** cross-section is shown having an arcuate shape, it is understood that other configurations, e.g., a V-shaped channel, will serve as well.

Figure 2B:
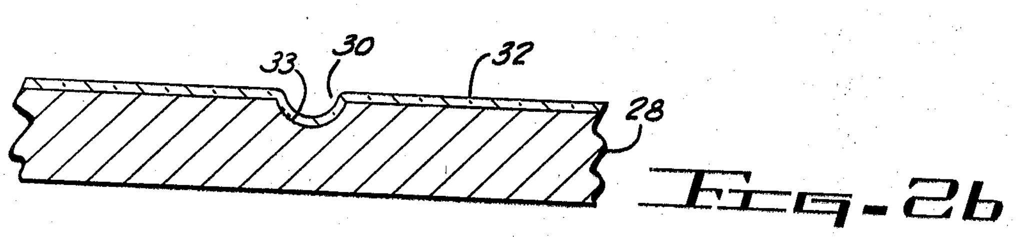
Figure 2C:
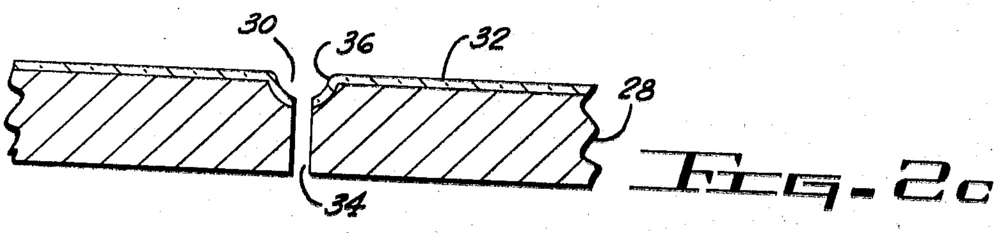

Referring now to FIG. 2*b*, after a standard cleaning operation, a layer 32 of silicon dioxide was vacuum deposited on the entire active surface of the wafer 28, including the channel 30. The thickness of the deposited layer 32 of silicon dioxide was 2.3 microns on one set of wafers; 1.3 microns on another set. Depositing the passivating layer 32 after the channel 30 has been formed greatly reduces the possibility of deleterious effects (viz., lead to silicon shorting) from chipping of the layer 32 during dicing.

A first layer of passivating material may also be deposited on the substrate prior to forming the channel 30, and another continuous or patterned layer deposited subsequently to cover the silicon surface 33 exposed by cutting the channel 30.

After deposition of the silicon dioxide layer 32, the wafers were returned to the standard integrated circuit wafer fabrication process, the next step of which was the formation of the apertures 23 in the silicon dioxide at the contact pad 20 regions (FIGS. 1 and 3). The wafers 28 were then diced, see FIG. 2*c*, using 3-mil diameter stainless steel wire and 600 grit silicon carbide slurry. Other dicing techniques may be utilized, e.g., diamond-wheel sawing, and laser cutting or chemical etching from the back side of the wafer. The width of the separating kerf 34 must be substantially less than the width of the channel 30 in order to yield a functional chamfer 36 at the top edge of the separation. For example, in the presently described embodiment, the channel 30 is approximately 8-mils wide; the separating kerf 34, approximately 4-mils wide. The bisected channel thus forms two functional chamfered edges 36, each at least 2-mils wide.

FIG. 3 illustrates a fragment of a microelectronic assembly fabricated in accordance with the process of the present invention. The cantilevered lead 24 attached to the contact pad 20 was forced downward to make electrical contact with the circuit 16 of the substrate 14. The ability of the layer 32 of silicon dioxide to cover and protect the chamfered silicon edge 36 and prevent the lead 24 from shorting to the bulk silicon material 26 is illustrated in FIG. 3. The submerged end 38 of the chamfered edge 36 was well below the lead 24 in all samples observed. Therefore, any chipping or voids which might be produced by the separating kerf in that area 38, presented no potential for electrical shorts between the lead 24 and the bulk silicon 26. All wafers and chips processed in accordance with my invention were examined by emissive mode electron microscopy in a Cambridge Stereoscan Mark IIA scanning electron microscope. Observations were made normal to the cross-sectioned surface and at a 45° angle to the top surface. The property of prime interest was silicon dioxide continuity at the top breaking edge of the chamfer 36. In all instances, the silicon dioxide was observed to be continuous across the edge 36 and down into the chamfer. Edge and surface protection appeared complete for both 1.3 micron and 2.3 micron silicon dioxide thicknesses. Suspected defects, which at first appeared as voids in the layer of silicon dioxide at the chamfered edge 36 were, in fact, found to be continuous $SiO_2$ when examined microscopically. There was negligible difference seen under SEM observation between the surface characteristics of the passivated grooves produced with 600 grit slurry and the grooves produced with 1000 grit slurry.

It appears, therefore, that the chamfered edge, silicon dioxide passivating technique is a valid and workable solution to the edge-to-lead shorting problem. The passivation afforded by a silicon dioxide layer covering a wire-sawed channel in the bulk silicon material was complete, even at silicon dioxide thickness of 1.3 microns. Other techniques such as chemical etching could of course be used to produce a groove or channel. Regardless of the grooving technique used, however, this solution to the edge-shorting problem is more desirable and less expensive than mechanical lead forming. The present invention solves the problem utilizing batch processing at the wafer level; it is both less expensive and more reliable than lead forming.

While the principles of my invention have now been made clear in the foregoing description, it will be immediately obvious to those skilled in the art that many modifications of structure, arrangement, proportion, the elements, material and components may be used in the practice of the invention which are particularly adapted for specific environments without departing from those principles. The appended claims are intended to cover and embrace any such modifications within the limits only of the true spirit and scope of my invention.

What is claimed is:

1. An improved method in microelectronic circuit fabrication and assembly providing nonabrasive electrically passive edges on face-up mounted chips, the improvement comprising the steps of:

forming a channel in a kerf area on an active surface of a wafer of semiconductor material;

depositing a layer of passivating material on the active surface of the wafer, the layer covering the channel formed in the previous step;

separating the wafer into individual chips along the centerline of the channel, the separating kerf having a width substantially less than the width of the channel, the remaining portions of the bisected channel forming chamfered, passivated edges on each of the separated chips;

attaching a lead to a contact pad of one of the individual chips, the lead being free cantilevered over the remaining channel portion of the chip;

attaching the one chip face-up to one surface of a planiform insulator, the lead aligned over an external circuit formed on the one surface; and forcing the cantilevered lead toward the external circuit to make electrical contact therewith, the chamfered passivated edge reducing the probability of electrical shorts between the lead and the semiconductor material of the chip.

2. An improved method in microcircuit fabrication and assembly providing nonabrasive electrically passive edges on face-up mounted chips, the improvement comprising the steps of:

forming a channel in a kerf area on an active surface of a wafer of semiconductor material;

depositing a layer of passivating material on the surface of the wafer, the layer covering the channel formed in the previous step;

attaching a lead to a contact pad on the active surface, the lead freely extending in a cantilevered fashion over the channel;

separating the wafer into individual chips along the centerline of the channel, the separating kerf having a width substantially less than the width of the channel, the remaining portions of the bisected channel forming chamfered, passivated edges on the chips;

attaching the chip having the lead face-up to one surface of a planiform insulator, the lead aligned over an external circuit formed on the one surface; and forcing the cantilevered lead toward the external circuit to make electrical contact therewith, the chamfered passivated edge reducing the probability of electrical shorts between the lead and the semiconductor material of the chip.

3. An improved method in microcircuit fabrication and assembly providing nonabrasive electrically passive edges on face-up mounted integrated circuit dice, the improvement comprising the steps of:

forming a channel in a kerf area on an active surface of a wafer of semiconductor material, after circuits have been formed on the active surface of the wafer but prior to final wafer passivation;

depositing a layer of passivating material on the active surface of the wafer, the layer covering the channel formed in the previous step;

dicing the wafer along the centerline of the channel, the separating kerf having a width substantially less than the width of the channel, the remaining portions of the bisected channel forming chamfered, passivated edges on each of the dice;

attaching a lead to a contact pad of at least one of the circuits, the lead freely extending in cantilevered fashion over the remaining channel portion of the die;

attaching the die having the lead attached thereto to one surface of a planar substrate having an external circuit formed thereon, the plane of the lead separated from the plane of the external circuit by the thickness of the die, the lead aligned over the external circuit; and forcing the extended portion of the lead toward the external circuit to make electrical contact therewith, the chamfered passivated edge reducing the probability of electrical shorts between the lead and the semiconductor material of the die.

* * * * *